United States Patent
Hwang et al.

(10) Patent No.: US 7,295,488 B2
(45) Date of Patent: Nov. 13, 2007

(54) APPARATUS AND METHODS FOR GENERATING A COLUMN SELECT LINE SIGNAL IN SEMICONDUCTOR MEMORY DEVICE

(75) Inventors: Sung-Min Hwang, Jeonranam-do (KR); Jae-Woong Lee, Gyeonggi-do (KR); Sang-Seok Kang, Gyeonggi-do (KR); Choong-Sun Shin, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 11/272,900

(22) Filed: Nov. 14, 2005

(65) Prior Publication Data

US 2006/0126421 A1    Jun. 15, 2006

(30) Foreign Application Priority Data

Dec. 13, 2004    (KR) .................. 10-2004-0104713

(51) Int. Cl.
*G11C 7/00*    (2006.01)
(52) U.S. Cl. .................. 365/230.06; 365/194
(58) Field of Classification Search .......... 365/230.06, 365/194
See application file for complete search history.

(56) References Cited

U.S. PATENT DOCUMENTS

| 6,038,176 A * | 3/2000 | Shyu ..................... 365/189.01 |
| 6,172,919 B1 * | 1/2001 | Horikawa .................. 365/190 |
| 6,856,574 B2 * | 2/2005 | Iwahashi et al. ............ 365/233 |
| 6,972,978 B1 * | 12/2005 | Miller et al. .................. 365/49 |
| 2002/0051404 A1 * | 5/2002 | Ooishi et al. ............... 365/233 |
| 2004/0104713 A1 | 6/2004 | Mariani et al. ............. 323/282 |
| 2005/0073895 A1 * | 4/2005 | Yahata et al. ............... 365/222 |

* cited by examiner

*Primary Examiner*—Michael T Tran
(74) *Attorney, Agent, or Firm*—Myers Bigel Sibley & Sajovec

(57) ABSTRACT

An apparatus for generating a column select line signal in a semiconductor memory device includes a column select line signal generator configured to generate a column select line signal in response to a column select line enable signal. The column select line signal has a first pulse width when the column select line signal generator is in a first operational mode and a second pulse width when the column select line signal generator is in a second operational mode. The second pulse width is longer than the first pulse width.

24 Claims, 9 Drawing Sheets

APPARATUS AND METHODS FOR GENERATING A COLUMN SELECT LINE SIGNAL IN SEMICONDUCTOR MEMORY DEVICE

CROSS-REFERENCE TO RELATED APPLICATION

This application claims priority to Korean Patent Application No. 10-2004-0104713, filed Dec. 13, 2004, the disclosure of which is hereby incorporated herein by reference in its entirety.

FIELD OF THE INVENTION

The present invention relates to semiconductor memory devices, and more particularly, to apparatus for generating a column select line signal in a semiconductor memory device and methods for generating a column select line signal in a semiconductor memory device.

BACKGROUND OF THE INVENTION

One of the factors characterizing the operating properties of semiconductor memory devices is an AC parameter called tRDL, which relates to the timing of operations in a semiconductor memory device. In particular, the tRDL parameter is closely associated with the number of cycles of a column select line (CSL) signal. The CSL signal selects a column associated with a group of related memory elements. When an ongoing write operation is interrupted, for example, by a row precharge command, while data is being written during cycles of the column select line signal, it may be desirable to wait for a time delay at least equal to the tRDL period in order to ensure that the last data bit is completely written before the row precharge command is processed.

FIG. 1 is a timing diagram illustrating the function of the tRDL parameter.

As shown in FIG. 1, tRDL is a time period from a time point when the last data bit Db3 of a series of data bits (e.g., Db0, Db1, Db2 and Db3) is applied to a bit line in a response to a write command WR to a time point when a row precharge command (RPC) may be processed.

FIG. 2 is a schematic block diagram of a column selection circuit 100 in a conventional semiconductor memory device.

Referring to FIG. 2, a conventional column selection circuit 100 may include a command buffer 22, a column select line enabling unit 24, a column select line disabling unit 25, a column select line driver 26, a PDT generator 27, an IO driver/MUX 28, a bit line sense amplifier 29, and a memory cell MC coupled between a bit line BLUBB and a word line WL.

The command buffer 22 outputs an operation activation signal (e.g. a write activation signal PWAX or a read activation signal PCA) in response to an operation command signal CMD and a clock signal CLK. operation command may be one of a read command, a write command and/or a row precharge command.

Upon receipt of the operation activation signal, the column select line enabling unit 24 outputs a column select line enable signal PCSLE.

Upon receipt of the operation activation signal, the column select line disabling unit 25 generates a column select line disable signal PCSLD in a subsequent clock cycle, which may be, for example, the next clock cycle following the clock cycle in which the column select line enable signal PCSLE was generated.

Under control of the column select line enable signal PCSLE and the column select line disable signal PCSLD, the column select line driver 26 outputs a column select line signal CSL.

The PDT generator 27 receives the column select line signal CSL and responsively generates a PDT signal as an enable signal for the 10 driver/MUX 28.

A transistor TR1 is turned on when the column select line signal CSL is in a high state, and the IO driver/MUX 28 is enabled by the PDT signal, such that data to be written is sensed by the bit line sense amplifier 29 and applied to a bit line BL/BLB. The data is then written to the memory cell MC.

FIG. 3 is a timing diagram showing processes in which the column select line signal CSL of FIG. 2 may be generated.

Referring to FIG. 3, timing waveforms are shown for a clock signal CLK, operation activation signals PWAX and PCA, a column select line enable signal PCSLE, a column select line disable signal PCSLD, and a column select line signal CSL. The command signals WR1, WR2 and RD correspond to the CMD signal of FIG. 2. Specifically, the command signals include write commands WR1 and WR2 and a read command RD.

As shown in FIG. 3, after a write command WR1 is applied in a first clock cycle 1TCK, the write activation signal PWAX is generated in the following cycle of the clock signal CLK as indicated by arrow 51.

The column select line enable signal PCSLE is generated in response to the write activation signal PWAX (arrow 52) which causes the column select line signal CSL to be shifted to a high state (i.e. set) (arrow 53). That is, the column select line signal CSL is set in response to the column select line enable signal PCSLE being activated.

The column select line disable signal PCSLD is generated in response to a second clock cycle 2TCK following the first clock cycle 1TCK (arrow 54). The column select line disable signal PCSLD causes the column select line signal CSL to reset (arrow 55) (i.e., to shift the column select signal CSL to a low state).

Next, in the sequence illustrated in FIG. 3, the write activation signal PWAX is again generated in response to a second write command WR2 applied in the third clock cycle 3TCK, such that the column select line signal CSL is again generated according to the same process as when the first write command WR1 was applied.

A read activation signal PCA is generated in a subsequent clock cycle in response to the read command RD (arrow 56). The read activation signal PCA also causes the column select line enable signal PCSLE to be generated (arrow 57). The column select line signal CSL is again activated in response to the column select line enable signal PCSLE (arrow 58).

The column select line disable signal PCSLD is generated in response to the next clock cycle after the clock cycle in which the read command RD was generated (arrow 59) to inactivate the column select line signal CSL (arrow 60).

If the write activation signal PWAX were generated instead of the read activation signal PCA, i.e., if a write command were applied instead of the read command RD, the column select line signal CSL would be activated or inactivated in the same process, except that the column select line enable signal PCSLE would be generated in response to the write activation signal PWAX.

In the system described above, the column select line signal CSL has a single operational mode in which the column select line signal is activated in response to the column select line enable signal PCSLE in a first clock cycle and is inactivated by the column select line disable signal PCSLD generated in response to the clock cycle following the clock cycle which caused the column select line enable signal PCSLE to be generated.

Therefore, there is a potential problem in that, when a bit line is precharged following a write command, the word line of the memory cell may be disabled after the last data bit to be written to the memory cell is applied to the bit line but before the last data bit is written to the memory cell, such that the last data bit may not be completely written to the memory cell, which may result in loss and/or corruption of data.

SUMMARY OF THE INVENTION

An apparatus for generating a column select line signal in a semiconductor memory device according to some embodiments of the invention includes a column select line signal generator configured to generate a column select line signal in response to a column select line enable signal. The column select line signal has a first pulse width when the column select line signal generator is in a first operational mode and a second pulse width when the column select line signal generator is in a second operational mode. The second pulse width is longer than the first pulse width.

Some embodiments of the invention may further include a command buffer configured to receive an operation command and responsively generate an operation activation signal, and a column select line enabling unit configured to receive the operation activation signal and responsively generate a column select line enable signal. The column select line signal generator is in the first operational mode when an operation command is applied to the command buffer within a predetermined number of clock cycles after a write command is applied to the command buffer, and the column select line generator is in the second operational mode when an operation command is not applied to the command buffer within the predetermined number of clock cycles after a write command is applied to the command buffer.

The operation command may be one of a read command, a write command and/or a row precharge command. In some embodiments, the predetermined number of clock cycles is two clock cycles.

The column select line signal generator may further include a column select line signal generating circuit configured to set the column select line signal in response to a column select line enable signal and to reset the column select line signal in response to a first period control signal and/or a second period control signal, and a period control signal generating circuit configured to generate the first period control signal in response to an operation activation signal and to generate the second period control signal in response to a column select line disable signal.

A column select line disable signal may be generated in response to a clock cycle following the clock cycle in which the write command is applied.

The column select line signal generator may be in the first operational mode when a command is applied to the command buffer within two clock cycles after a write command is applied to the command buffer. Likewise, the column select line signal generator may be in the second operational mode when a command is applied to the command buffer more than two clock cycles after a write command is applied to the command buffer.

An apparatus for generating a column select line signal in a semiconductor memory device according to further embodiments of the invention includes a column select line signal generator including (i) a column select line signal generating circuit configured to set the column select line signal in response to a column select line enable signal and to reset the column select line signal in response to the earlier of a first period control signal or a second period control signal, and (ii) a period control signal generating circuit configured to generate the first period control signal in response to an operation activation signal and to generate the second period control signal in response to a column select line disable signal. In particular embodiments, the column select line disable signal may include a delayed column select line disable signal.

The apparatus may include a command buffer configured to receive an operation command and responsively generate the operation activation signal, a column select line enabling unit configured to generate a column select line enable signal in response to the operation activation signal, and a column select line disabling unit configured to generate a column select line disable signal in response to the operation activation signal and a clock signal. A delay cell may be configured to receive the column select line disable signal and responsively generate a delayed column select line disable signal.

In some embodiments of the invention, the column select line disabling unit may be configured to generate the column select line disable signal in response to a clock cycle of the clock signal following the clock cycle in which the operation command is applied to the command buffer. The column select line disabling unit may be configured to generate the column select line disable signal in a clock cycle that is at least two clock cycles after the clock cycle in which the operation activation signal is generated.

An apparatus for generating a column select line signal in a semiconductor memory device according to further embodiments of the invention includes a command buffer configured to receive an operation command and responsively generate a pre-command pulse, and a column select line signal generator including (i) a column select line signal generating circuit configured to set the column select line signal in response to a column select line enable signal and to reset the column select line signal in response to the earlier of a first period control signal or a second period control signal, and (ii) a period control signal generating circuit configured to generate the first period control signal in response to the pre-command pulse and to generate the second period control signal in response to a column select line disable signal.

The pre-command pulse may have a shift point that is substantially synchronous with a clock cycle following a clock cycle in which the operation command is applied to the command buffer.

The apparatus may further include a delay cell configured to generate a delayed column select line disable signal. Accordingly, the period control signal generating circuit may be configured to generate the second period control signal in response to the delayed column select line disable signal.

The column select line signal generator may have a first operational mode when an operation command is applied to the command buffer within a predetermined number of clock cycles after a write command is applied to the command buffer and a second operational mode when an operation command is not applied to the command buffer within the predetermined number of clock cycles after a write command is applied to the command buffer. The column select line signal may have a first pulse width when the column select line signal generator is in the first operational mode and a second pulse width when the column select line signal generator is in the second operational mode.

The second pulse width may be longer than the first pulse width. The predetermined number of clock cycles may be two clock cycles.

A semiconductor memory device according to some embodiments of the invention includes a memory cell array having a plurality of memory blocks in which unit memory cells each having an access transistor and a storage capacitor are connected at respective intersections between rows and columns in a matrix form, a row selecting circuit for selecting rows of the memory cells, and a column selecting circuit for selecting columns of the memory cells using a column select line signal. The column selecting circuit includes a column select line signal generator including (i) a column select line signal generating circuit configured to set the column select line signal in response to a column select line enable signal and to reset the column select line signal in response to the earlier of a first period control signal or a second period control signal, and (ii) a period control signal generating circuit configured to generate the first period control signal in response to an operation activation signal and to generate the second period control signal in response to a column select line disable signal.

The device may further include a command buffer configured to receive an operation command and responsively generate the operation activation signal, a column select line enabling unit configured to generate a column select line enable signal in response to the operation activation signal, and a column select line disabling unit configured to generate a column select line disable signal in response to the operation activation signal and a clock signal.

The column select line signal generator may have a first operational mode when an operation command is applied to the command buffer within a predetermined number of clock cycles after a write command is applied to the command buffer and a second operational mode when an operation command is not applied to the command buffer within the predetermined number of clock cycles after a write command is applied to the command buffer. The column select line signal may have a first pulse width when the column select line signal generator is in the first operational mode and a second pulse width different from the first pulse width when the column select line signal generator is in the second operational mode.

The second pulse width may be longer than the first pulse width. The predetermined number of clock cycles may be two clock cycles.

A circuit for generating a column select line signal in a semiconductor memory device according to some embodiments of the invention includes a continuity determination unit configured to determine if an operation command is applied within a predetermined time period after a write command is applied and a signal generator operably connected to the continuity determination unit and configured to generate a column select line signal having a different pulse width depending on whether the operation command is input within the predetermined time period after the write command.

The predetermined time period may be two clock cycles after a write command is applied.

According to some embodiments of the invention, methods are provided for generating a column select line signal in a semiconductor memory device including a column selection circuit configured to select a column line connected to a memory cell for data access. The methods may include generating a column select line signal in response to a column select line enable signal, the column select line signal having a first pulse width when the column selection circuit is in a first operational mode and a second pulse width when the column selection circuit is in a second operational mode. The second pulse width may be longer than the first pulse width.

The methods may further include receiving an operation command and responsively generating an operation activation signal and generating a column select line enable signal in response to the operation activation signal. The column selection circuit is in the first operational mode when an operation command is applied to a command buffer within a predetermined number of clock cycles after a write command is applied to the command buffer, and the column selection circuit is in the second operational mode when an operation command is not applied to the command buffer within the predetermined number of clock cycles after a write command is applied to the command buffer. The predetermined number of clock cycles may be two clock cycles.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It also will be understood that, as used herein, the terms "row" and "column" indicate two non-parallel directions that may be orthogonal to one another. However, the terms row and column do not indicate a particular horizontal or vertical orientation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
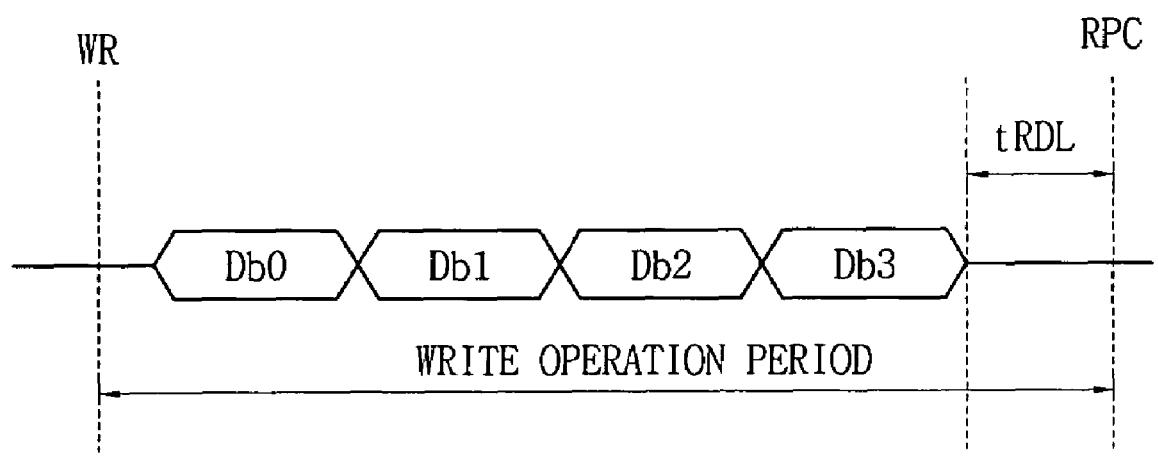
FIG. 1 is a timing diagram illustrating the tRDL parameter.
Figure 2:
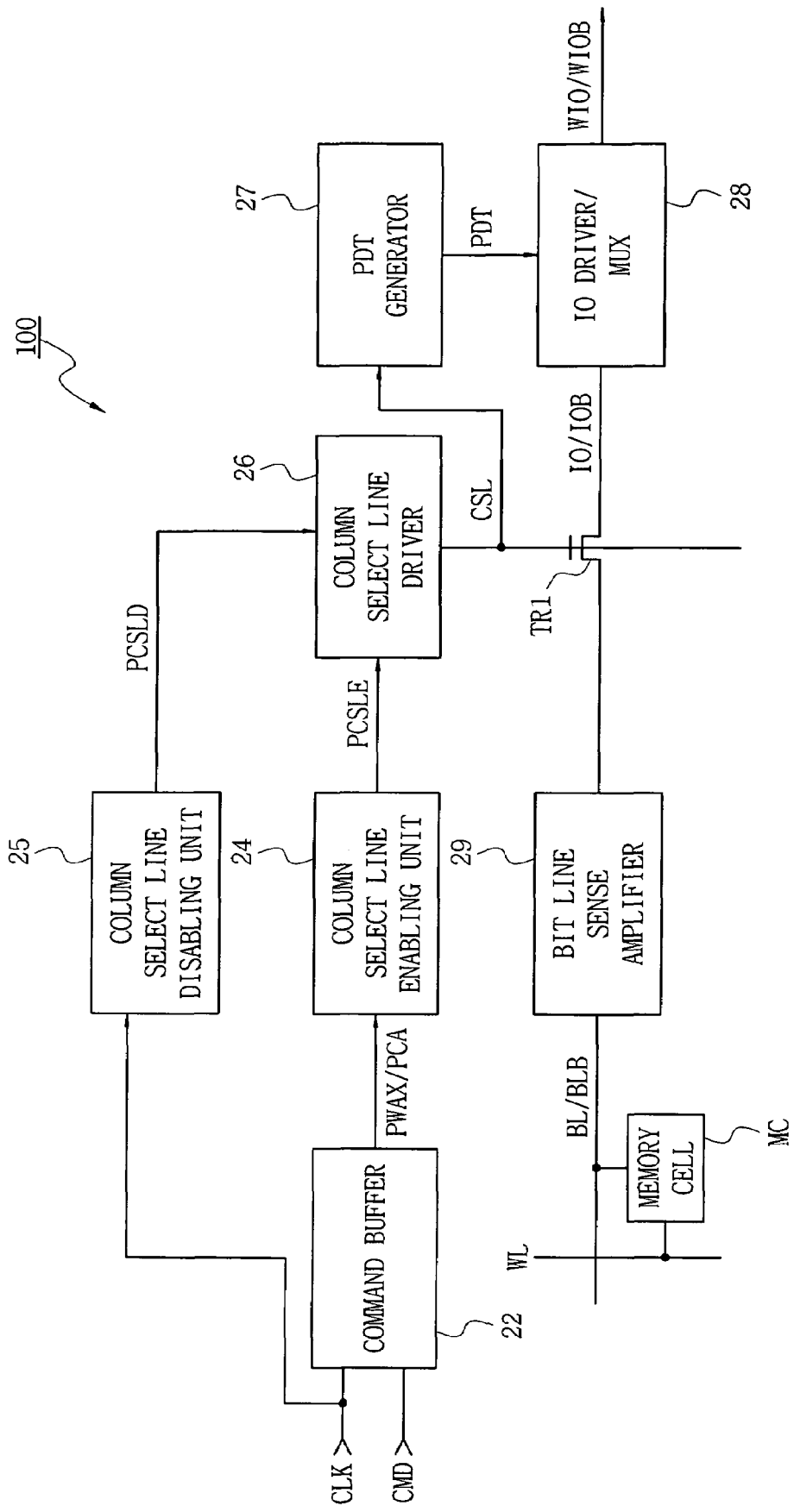
FIG. 2 is a schematic block diagram of a column selection circuit in a conventional semiconductor memory device.
Figure 3:
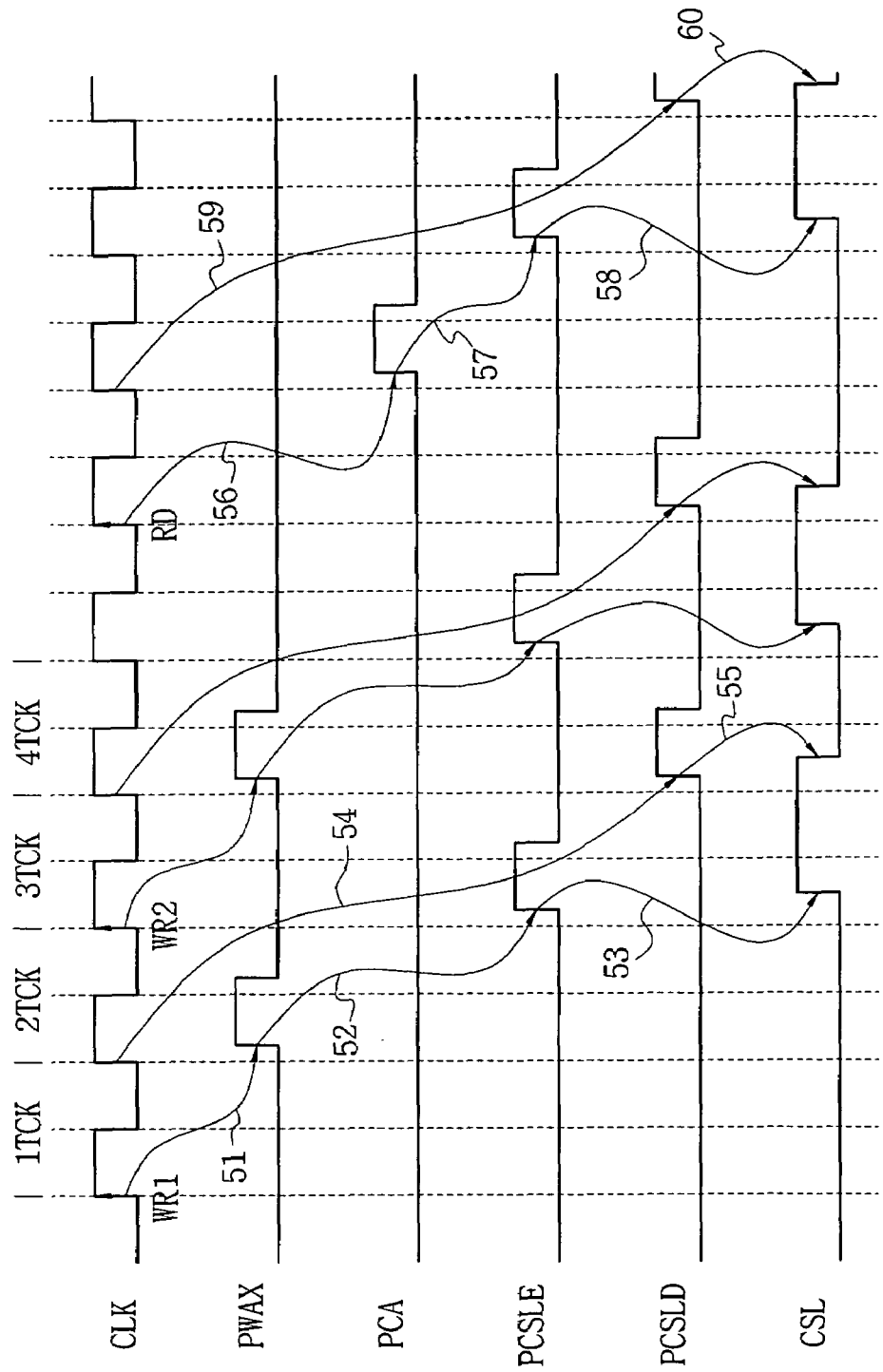
FIG. 3 is a timing diagram showing a process in which a column select line signal of FIG. 2 may be generated.
Figure 4:
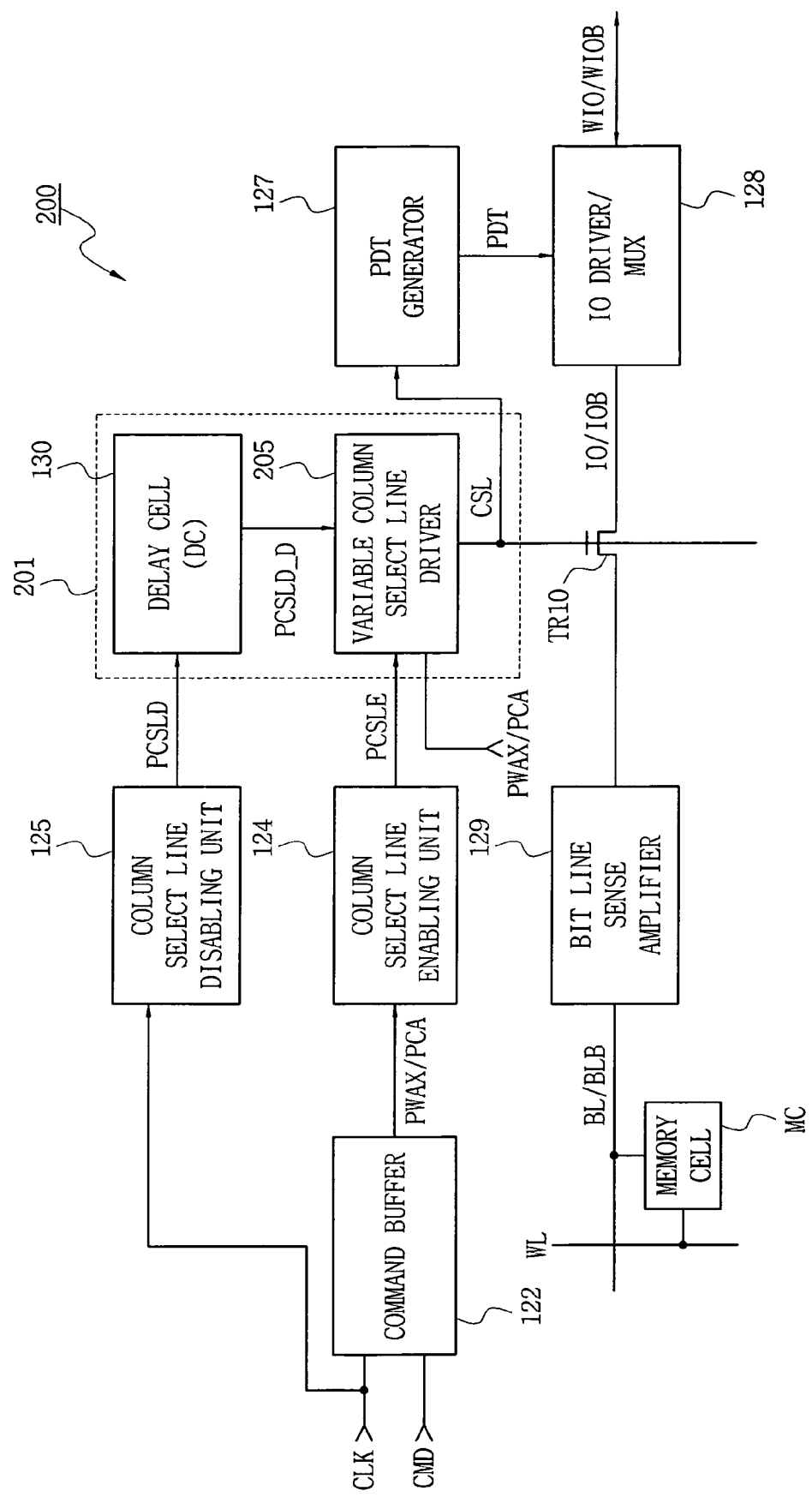
FIG. 4 is a schematic block diagram of a column selection circuit in a semiconductor memory device according to some embodiments of the invention.

FIG. 4 is a schematic block diagram of a column selection circuit 200 of a semiconductor memory device according to some embodiments of the invention.

Referring to the embodiments of FIG. 4, a column selection circuit 200 includes a command buffer 122, a column select line enabling unit 124, a column select line disabling unit 125, a PDT generator 127, an 10 driver/MUX 128, a bit line sense amplifier 129, a memory cell MC and a column select line signal generator 201. The column select line signal generator 201 may include a delay cell 130 and a variable column select line driver 205.

The command buffer 122 receives an operation command signal CMD and a clock signal CLK, and responsively generates operation activation signals PWAX and/or PCA, which are provided to a column select enabling unit 124. The operation command may include one of a read command, a write command and/or a row precharge command.

The column select line enabling unit 124 receives the operation activation signals PWAX and/or PCA and responsively generates a column select line enable signal PCSLE. That is, the column select line enabling unit 124 generates the column select line enable signal PCSLE in response to the operation activation signals PWAX and/or PCA.

The column select line disabling unit 125 receives the operation activation signals PWAX and/or PCA and generates a column select line disable signal PCSLD in a subsequent clock cycle, for example, in the next succeeding clock cycle. That is, the column select line disabling unit 125 may generate the column select line disable signal PCSLD in the clock cycle following the clock cycle in which the PCSLE signal was generated.

The variable column select line driver 205 in the column select line signal generator 201 may generate a column select line signal CSL when the column select line enable signal PCSLE is input. The column select line signal CSL may have a different pulse width depending on whether the column select line signal generator 201 is in a first or second operational mode. The operational mode may be determined by first and second period control signals, which may be generated based on timing of operation command signals CMD received at the command buffer 122. That is, the column select line signal generator 201 operates in a first operational mode when an operation command signal (CMD) is applied at the command buffer 122 within a predetermined time period after a write command is applied, and a second operational mode when a command signal is not applied at the command buffer 122 within a predetermined time period after a write command is applied. More specifically, a first period control signal is triggered in response to an operation activation signal (e.g. PWAX or PCA) and a second period control signal is triggered by the column select line disable signal PCSLD.

In both the first and second operational modes, the column select line signal CSL is activated (i.e. "set") by the column select line enable signal PCSLE in response to the operation activation signal PWAX or PCA. In the first operational mode, the column select line signal is inactivated (i.e. "reset") in response to an operation activation signal (PWAX or PCA) that is generated when a command signal is applied to the command buffer 122 within a predetermined time after the previous command (which caused the column select line signal CSL to be set) was applied. In the second operational mode, the column select line signal is inactivated (i.e. "reset") in response to a delayed column select line disable signal PCSLD_D.

In particular, the delay cell 130 of the column select line signal generator 201 delays the column select line disable signal PCSLD to generate a delayed column select line disable signal PCSLD_D. The delay cell (DC) 130 may include, for example, a commonly used delay circuit (e.g., one or more inverter circuits).

The PDT generator 127 receives the column select line signal CSL and responsively generates a PDT signal as an enable signal for 10 driver/MUX 128.

The transistor TR10 is turned on when the column select line signal is in a high state and the IO driver/MUX 128 is enabled by the PDT signal, such that data to be written is applied to a bit line BL/BLB by the bit line sense amplifier 129. The data is then written to the memory cell MC.

Figure 5:
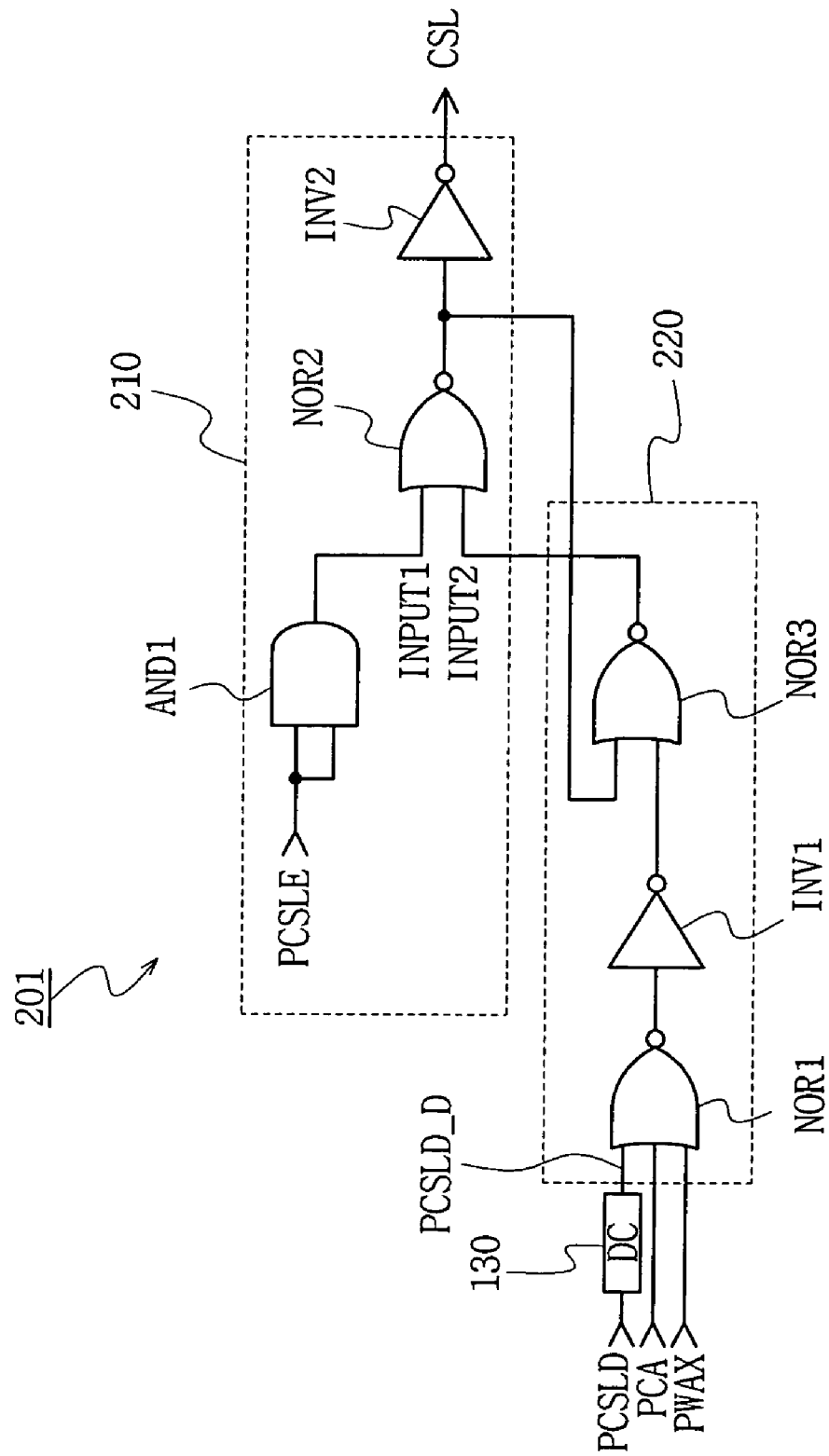
FIG. 5 is an equivalent circuit diagram of a column select line signal generating device of FIG. 4, according to some embodiments of the invention.

FIG. 5 is an equivalent circuit diagram of a column select line signal generator 201 of FIG. 4.

Referring to the embodiments of FIG. 5, a column select line signal generator 201 according to some embodiments of the invention may include a column select line signal generating circuit 210 and a period control signal generating circuit 220.

The column select line signal generating circuit 210 generates a column select line signal CSL having a first pulse width when an operation command signal CMD is applied within a predetermined time after a write command, and a second pulse width when an operation command signal CMD is not applied within a predetermined time after a write command. That is, the column select line signal CSL has a different pulse width depending on first and second period control signals provided by the period control signal generating circuit 220.

In the first operational mode, the period control signal generating circuit 220 outputs a first period control signal in response to an operation activation signal (PWAX/PCA) generated by the command buffer 122 (FIG. 4). In the second operational mode, the period control signal generating circuit 220 outputs a second period control signal in response to a delayed column select line disable signal PCSLD_D generated by the delay cell 130 (FIG. 4).

The period control signal generating circuit 220 may be regarded as a continuity determination unit which determines if an operation command CMD for data access is input within a predetermined time after a write command WR1 or WR2 based on the timing of the operation activation signal (PWAX/PCA) and the delayed column select line disable signal PCSLD_D. The column select line signal generating circuit 210 is operably connected to the period control signal generating circuit 220 to generate a column select line signal CSL having a different pulse width depending on whether an operation command signal CMD for data access is input within a predetermined time after a write command. In particular embodiments, the predetermined time may be two clock cycles after a write command is input.

Processes according to embodiments of the invention will be described in which the column select line signal CSL is generated by the column select line signal generating circuit 210 in conjunction with the period control signal generating circuit 220.

First, if the column select line enable signal PCSLE applied to an AND gate AND1 is in a high state, the input INPUT1 to the NOR gate NOR2 will be in a high state. Thus, the output of the NOR gate NOR2 will be in a low state, and the column select line signal CSL, which is supplied as the output of an inverter INV2, will be in a high state irrespective of the logical state of the other input INPUT2 of the NOR gate NOR2. That is, the column select line signal CSL is activated in response to the column select line enable signal PCSLE being in a high state, regardless of the output of the period control signal generating circuit 220.

On the other hand, when the PCSLE signal is low, the output of the column select line signal generating circuit 210 will be determined by the state of the PCSLD_D, PCA and/or PWAX signals. For example, assuming that the column select line enable signal PCSLE is in a low state, if a read activation signal PCA or a write activation signal PWAX generated in response to an operation command CMD is input to a NOR gate NOR1 of the period control signal generating circuit 220, or if a delayed column select line disable signal PCSLD_D is input to the NOR gate NOR1 via a delay cell 130, the output signal of the NOR gate NOR1 will have a low state. This low signal is inverted by an inverter INV1 and input to a NOR gate NOR3. Thus, the output signal of the NOR gate NOR3 will be in a low state if any of PCSLD_D, PCA or PWAX is in a high state. As such, since the two input signals INPUT1 and INPUT2 of the NOR gate NOR2 of the column select line signal generating circuit 210 are both in a low state, the output signal of the NOR gate NOR2 will be in a high state.

The output signal of the NOR gate NOR2 is inverted by the inverter INV2 such that the final column select line signal CSL will be in a low state. As a result, the column select line signal CSL is activated by the column select line enable signal PCSLE and is inactivated in response to an earlier one of the read activation signal PCA or the write activation signal PWAX, or the delayed column select line disable signal PCSLD_D. Thus, in the first operational mode, the column select line signal CSL is reset in response to a first period control signal generated by the control signal generating circuit 220 in response to the read activation signal PCA or the write activation signal PWAX. In the second operational mode, the column select line signal CSL is reset in response to a second period control signal generated by the control signal generating circuit 220 in response to the delayed column select line disable signal PCSLD_D.

Figure 6:
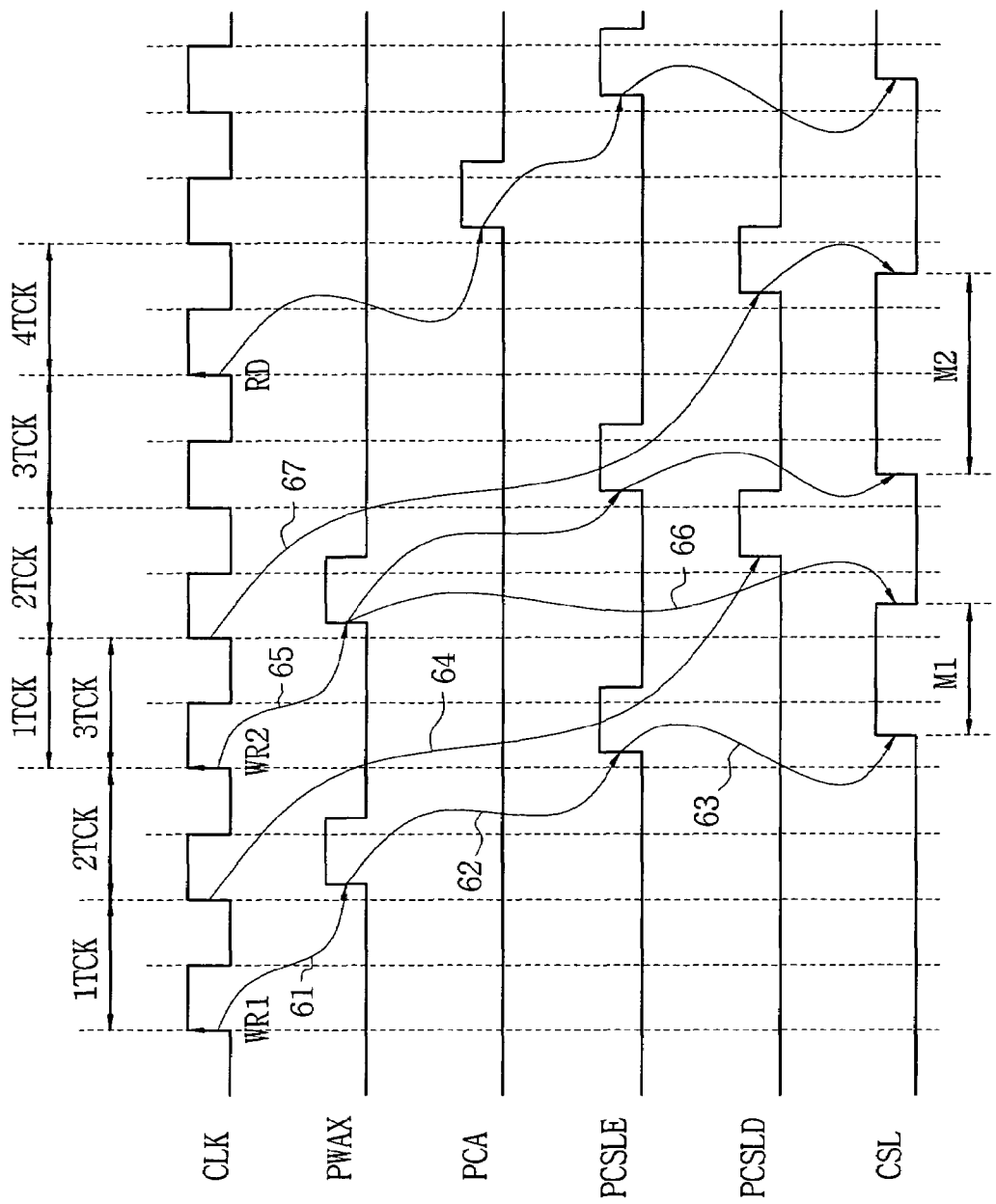
FIG. 6 is a timing diagram illustrating the operation of a column select line signal generating device of FIG. 5, according to some embodiments of the invention.

FIG. 6 is a timing diagram illustrating operations of a column select line signal generator 201 of FIG. 5.

Referring to the embodiments of FIG. 6, timing waveforms are shown for an operation clock CLK, write and read activation signals PWAX and PCA, a column select line enable signal PCSLE, a delayed column select line disable signal PCSLD_D, and a column select line signal CSL. An operation command CMD may include write commands WR1, WR2 and/or a read command RD. As illustrated in FIG. 6, the pulse width of the column select line signal CSL depends on whether the column select line signal generator 201 is in the first operational mode M1 or the second operational mode M2.

To write data to a memory cell, a write command WR1 is applied and a write activation signal PWAX is generated in response to a first clock cycle 1TCK of the clock CLK (arrow 61).

The column select line enable signal PCSLE is generated in response to the write activation signal PWAX (arrow 62), and the column select line signal CSL is activated by the column select line enable signal PCSLE (arrow 63). As discussed above, in both the first operational mode M1 and the second operational mode M2, the column select line signal CSL is activated in response to the column select line enable signal PCSLE.

The clock select line disable signal PCSLD is generated in response to a second clock cycle 2TCK following to the first clock cycle 1TCK (arrow 64).

In the first operational mode M1, an operation command CMD (such as a write command WR2 or a read command RD) is applied within two clock cycles after the write command WR1 is applied. In particular, if a write command WR2 is applied in a third clock cycle 3TCK as shown, the write activation signal PWAX is triggered in response to a third clock cycle 3TCK (arrow 65), which is two cycles after the first clock cycle 1TCK in which the initial write command WR1 was applied. Thus, in the first operational mode M1, the column select line signal CSL is reset in response to the write activation signal PWAX (arrow 66). A first period control signal (INPUT2 of FIG. 5), which is generated in response the write activation signal PWAX, thereby determines the pulse width of the column select line signal CSL in the first operational mode.

Since the third clock cycle 3TCK is a clock cycle causing a second write command WR2 to respond, it may be considered a first clock cycle 1TCK' for the second write command WR2. That is, for purposes of illustrating the second operational mode M2, the third clock cycle 3TCK may also be considered as a first clock cycle 1TCK', as shown in FIG. 6.

In the second operational mode M2, a read command RD is applied after a predetermined time (e.g. more than two clock cycles) following a write command WR2. In this mode, the read command RD is applied in a fourth clock cycle 4TCK', which is the third clock cycle after the clock cycle 1TCK' in which the write command WR2 was applied.

That is, in the second operational mode M2, the column select signal CSL is reset by a delayed column select line disable signal PCSLD_D that is generated in response to the clock cycle 2TCK' immediately following the clock cycle 1TCK' in which the write command WR2 is applied (arrow 67). The delayed column select line disable signal PCSLD_D causes a second period control signal to be generated by control signal generating circuit 220 (FIG. 5). Thus, in the second operational mode, the second period control signal PCSLD_D may determine the pulse width of the column select line signal CSL.

Figure 7:
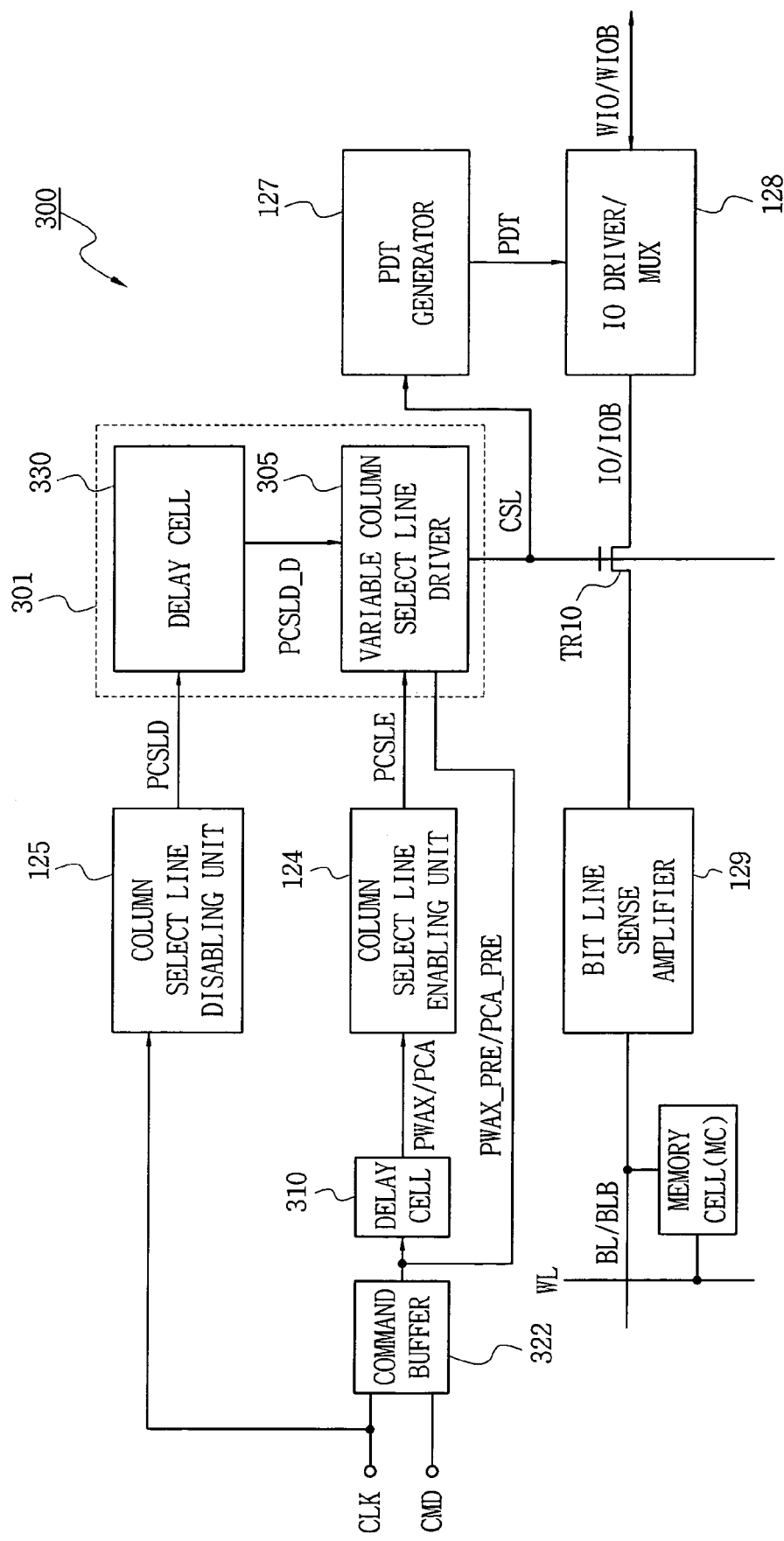
FIG. 7 is a schematic block diagram of a column selection circuit in a semiconductor memory device according to some embodiments of the invention.

FIG. 7 is a block diagram of a column selection circuit 300 according to further embodiments of the invention. Similar to the column selection circuit 200 of FIG. 4, the column selection circuit 300 includes a column select line enabling unit 124, a column select line disabling unit 125, a PDT generator 127, an IO driver/MUX 128, a bit line sense amplifier 129, and a memory cell MC. The column selection circuit 300 further includes a command buffer 322, a delay cell 310 coupled to an output of the command buffer 322, and a column select line signal generator 301.

The command buffer 322 receives an operation command signal CMD and a clock signal CLK, and responsively generates pre-command pulses PWAX_Pre and/or PCA_Pre. The pre-command pulses are provided to the delay cell 310, which responsively generates operation activation signals PWAX and/or PCA. The delay cell 310 may include, for example, a commonly used delay circuit (e.g., one or more inverter circuits).

The column select line enabling unit 124 receives the operation activation signals PWAX and/or PCA and responsively generates a column select line enable signal PCSLE. Likewise, the column select line disabling unit 125 generates a column select line disable signal PCSLD in response to a second clock cycle following the clock cycle in which the command signal was applied.

The column select signal generator 301 may include a delay cell 330 and a variable column select line driver 305. The delay cell 330 generates a delayed column select line disable signal PCSLD_D, which is provided to the variable column select line driver 305. The pre-command pulses (PWAX_Pre and/or PCA_Pre) are also provided to a variable column select line driver 305. The CSL signal is set by the variable column select line driver 305 in response to a column select line enable signal PCSLE received from the column select line enabling unit 124 and is reset in response to the earlier of the delayed column select line disable signal PCSLD_D generated by the delay cell 330 or the pre-command pulse (PWAX_Pre and/or PCA_Pre) generated by the command buffer 322. Thus, the CSL signal may have a different pulse width depending on the operational mode of the column select line generator 301. That is, in the first operational mode, the column select line signal CSL is reset in response to the pre-command pulse PCA_Pre or PWAX_Pre. In the second operational mode, the column select line signal CSL is reset in response to the delayed column select line disable signal PCSLD_D.

Figure 8:
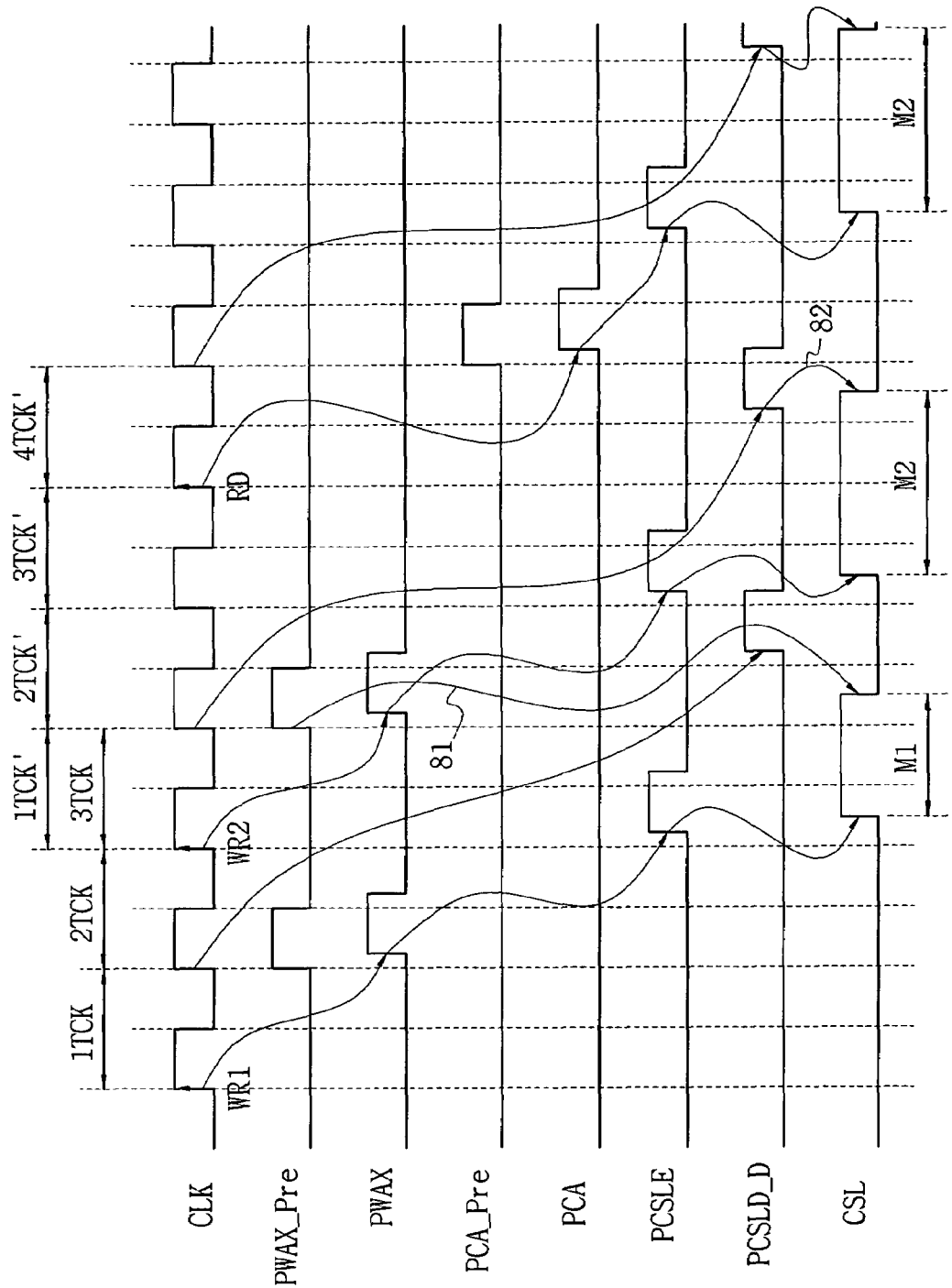
FIG. 8 is a timing diagram illustrating the operation of a column select line signal generating device according to further embodiments of the invention.

FIG. 8 is a timing diagram illustrating the operation of a column select line signal generator 301 illustrated in FIG. 7 according to some embodiments of the invention.

Referring to the embodiments of FIGS. 7 and 8, a column select line signal generator 301 includes a period control signal generating circuit (not shown) that outputs a first period control signal in response to pre-command pulses (PWAX_Pre and PCA_Pre), and outputs a second period control signal in response to a delayed column select line disable signal PCSLD_D. That is, a column select line signal generator 301 has a first operational mode M1 when a command CMD is applied within a predetermined time after a write command is applied, and a second operational mode M2 when a command CMD is applied subsequent to the predetermined time after a write command is applied. In some embodiments according to the invention, the predetermined time may be two clock cycles.

When a column select line enable signal PCSLE generated in response to a command CMD is input to the column select line signal generator 301, the column select line signal generator 301 generates a column select line signal CSL having a different pulse width depending on the operational mode M1 or M2 of the column select line generator 201, that is, depending on which of the first and/or second period control signals is received first. In the first operational mode M1, the period control signal generator (not shown) of the column select line signal generator 201 receives pre-command pulses PWAX_Pre and PCA_Pre having a shift point (i.e. a transition point from a low state to a high state, or vice-versa) substantially synchronous with the second clock cycle 2TCK, which follows the clock cycle 1TCK in which the command CMD was applied and responsively generates a first period control signal.

Thus, referring to FIG. 8, when a second write signal WR2 is applied within a predetermined time after the first write signal WR1 is applied, the pre-command pulse PWAX_Pre generated by the command buffer 322 in response to the second write signal generates a period control signal to reset the column select line signal CSL (arrow 81).

In the second operational mode M2, the period control signal generating circuit outputs a second period control signal having a different shift point from that of the first period control signal in response to a disable signal. The disable signal may, for example, be a delayed column select line disable signal PCSLD_D that is generated in response to the second clock cycle 2TCK. Thus, for example, when a read command RD is applied after a predetermined time after the second write signal WR2 is applied, the delayed column select line signal PCSLD_D acts as a period control signal to reset the column select line signal CSL (arrow 82), since, in that case, the PCA_Pre pre-command signal is activated after the delayed column select line signal PCSLD_D.

In the first operational mode M1, the pre-command pulses PWAX_Pre and PCA_Pre may be generated earlier than the delayed column select line disable signal PCSLD_D. In other words, the delayed column select line disable signal PCSLD_D may be generated later than the pre-command pulses PWAX_Pre and PCA_Pre.

In the second operational mode M2, the pre-command pulses PWAX_Pre and PCA_Pre may be generated later than the delayed column select line disable signal PCSLD_D. The column select line signal CSL is reset in response to an earlier one of the pre-command pulses PWAX_Pre and PCA_Pre, and the column select line disable signal PCSLD.

Further, since the shift point of the second period control signal may be later than that of the first period control signal, the column select line signal CSL may have a wider pulse width in the second operational mode M2.

Some embodiments of the invention provide a semiconductor memory device including a memory cell array having a plurality of memory blocks in which unit memory cells, each having an access transistor and a storage capacitor, are connected at respective intersections between rows and columns in a matrix form. The device may further include a row selecting circuit for selecting rows of the memory cells and a column selecting circuit for selecting columns of the memory cells. The column selecting circuit may include a column select line signal generator for generating a column select line signal having a first operational mode M1 when an operation command CMD is applied within a predetermined time after a write command WR1 or WR2 and a second operational mode M2 when the subsequent command CMD is not applied within the predetermined time after the write command WR1 or WR2, such that the column select signal CSL may have different pulse widths in the first and second operational modes M1 and M2.

The pulse width of the column select signal CSL may be determined in response to first and second period control signals when an enable signal is input. A period control signal generator generates a first period control signal in the first operational mode M1 and a second period control signal in the second operational mode M2 having a shift point different from that of the first period control signal.

The enable signal may be a column select line enable signal PCSLE generated in response to operation activation signals PWAX and/or PCA that are generated in response to an operation command CMD applied in a previous clock cycle. The first period control signal is triggered in response to the command, and the second period control signal is triggered in response to a column select line disable signal PCSLD generated in a subsequent clock cycle. The command is applied in response to a third clock cycle following the second clock cycle in the first operational mode M1, and applied in response to a fourth clock cycle following the third clock cycle in the second operational mode M2.

Methods for generating a column select line signal in a semiconductor memory device including a column selection circuit for selecting a column line connected to a memory cell for data access according to some embodiments of the invention include generating a column select line signal having a different pulse width depending on whether or not a command CMD for the data access is input within a predetermined time subsequent to a write command. The predetermined time may be a time in which a write command is input in response to a clock cycle that is two cycles earlier than a clock cycle causing the command CMD to respond.

According to some embodiments of the invention, a method for generating a column select line signal in a semiconductor memory device including a column selection circuit configured to select a column line connected to a memory cell for data access includes generating a column select line signal in response to a column select line enable signal, the column select line signal having a first pulse width when the column selection circuit is in a first operational mode and a second pulse width when the column selection circuit is in a second operational mode. The second pulse width may be longer than the first pulse width.

The methods may further include receiving an operation command and responsively generating an operation activation signal and generating a column select line enable signal in response to the operation activation signal. The column selection circuit is in the first operational mode when an operation command is applied to a command buffer within a predetermined number of clock cycles after a write command is applied to the command buffer, and the column selection circuit is in the second operational mode when an operation command is not applied to the command buffer within the predetermined number of clock cycles after a write command is applied to the command buffer. The predetermined number of clock cycles may be two clock cycles.

Figure 9:
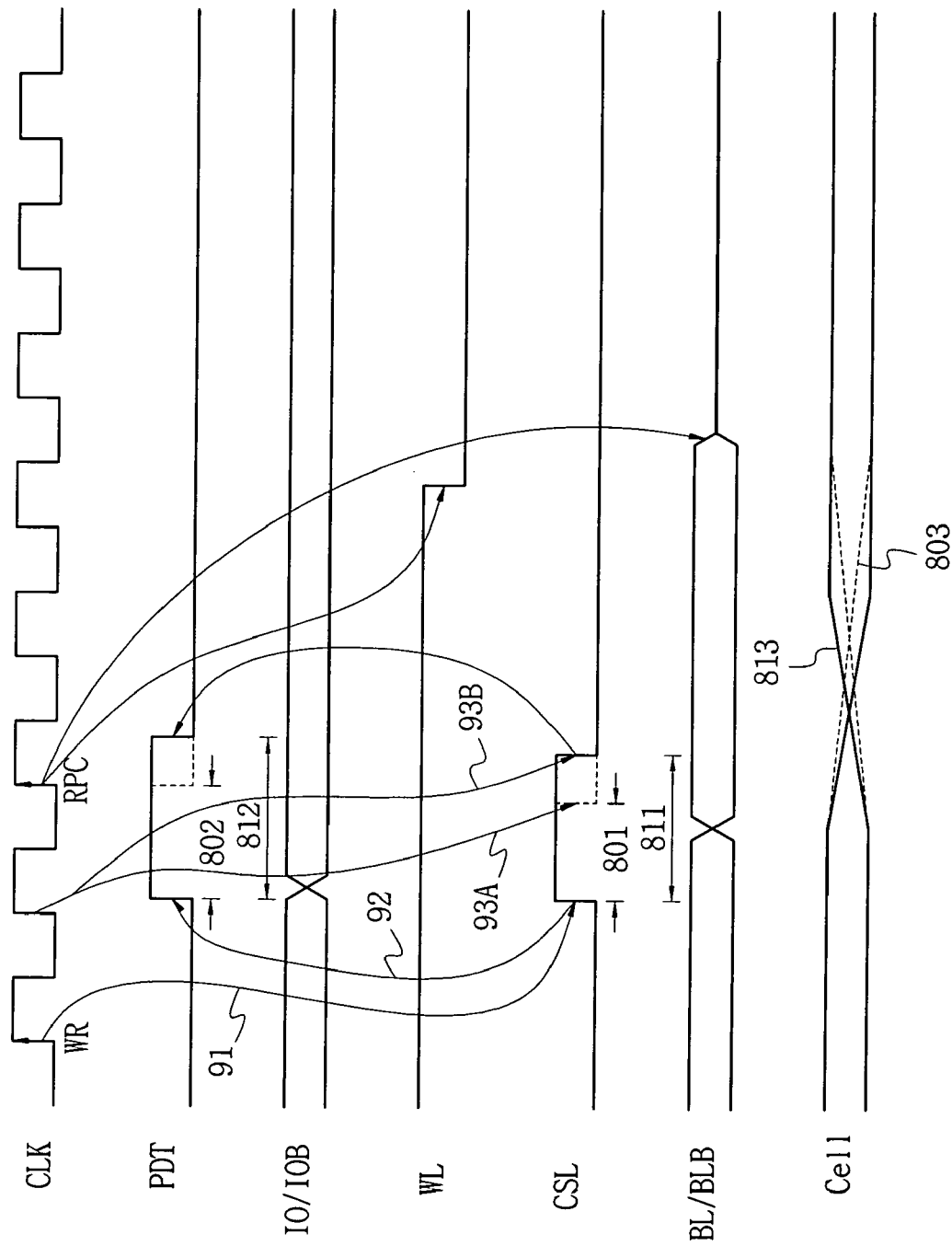
FIG. 9 is a timing diagram illustrating the operation of a column select line signal generating device of FIG. 5, according to some embodiments of the invention.

FIG. 9 is a timing diagram showing the writing of data to a memory cell using a column select line signal generator according to some embodiments of the invention.

Referring to FIG. 9, when an operation command (e.g., write command WR) is applied, a column select line signal CSL is generated in response (arrow 91). The detailed internal response and signal generation may be similar to that shown in FIG. 6 and/or 8. Thus, further descriptions thereof may be omitted.

In response to the column select line signal CSL, a PDT signal is generated (arrow 92) and provided as an enable signal to an 10 driver/MUX. The column select line signal CSL is reset in a subsequent clock cycle (arrows 93A, 93B). The column select line signal CSL is lowered at a different time in the first operational mode 801 compared with the second operational mode 811, as described in reference to FIGS. 6 and 8. Therefore, a connection of the IO driver/MUX path may be kept for a longer time period in the second operational mode. This may make the final data writing time different between the first operational mode 803 and the second operational mode 813. That is, the final data may be written more quickly in the second operational mode. Thus, the bit line may not be precharged until after the last data has been written to the memory cell, thereby reducing the possibility of damage or corruption to the data.

As described above, according to some embodiments of the invention, a column select line signal may have a different operational mode depending on the time at which a read or write command is applied relative to a previous command.

Apparatus, devices and methods according to some embodiments of the invention may also be capable of writing data to a memory cell without loss of the data by providing an enhanced column select line signal generating device which does not precharge a bit line before the last data bit is written to the memory cell.

Apparatus, devices and methods according to some embodiments of the invention may also be capable of reducing loss of data to be written to a memory cell by providing an enhanced column select signal generating device that allows the operating parameter tRDL to be shortened before precharge.

Apparatus, devices and methods according to some embodiments of the invention may also be capable of providing an advanced row precharge time point and/or high speed operation of a semiconductor memory device by providing an enhanced column select signal generating circuit that allows the width of a column select line signal to be increased upon a command being applied subsequent to a write command so that data may be rapidly written to a memory cell.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. An apparatus for generating a column select line signal in a semiconductor memory device, comprising:
   a column select line signal generator configured to generate a column select line signal in response to a column select line enable signal, the column select line signal having a first pulse width when the column select line signal generator is in a first operational mode and a second pulse width when the column select line signal generator is in a second operational mode, wherein the second pulse width is longer than the first pulse width a command buffer configured to receive an operation command and responsively generate an operation activation signal; and a column select line enabling unit configured to receive the operation activation signal and responsively generate a column select line enable signal; wherein the column select line signal generator is in the first operational mode when an operation command is applied to the command buffer within a predetermined number of clock cycles after a write command is applied to the command buffer, and the column select line generator is in the second operational mode when an operation command is not applied to the command buffer within the predetermined number of clock cycles after a write command is applied to the command buffer.

2. The apparatus of claim 1, wherein the operation command comprises one of a read command, a write command and/or a row precharge command.

3. The apparatus of claim 1, wherein the predetermined number of clock cycles is two clock cycles.

4. The apparatus of claim 1, wherein the column select line signal generator comprises:
a column select line signal generating circuit configured to set the column select line signal in response to a column select line enable signal and to reset the column select line signal in response to a first period control signal and/or a second period control signal; and
a period control signal generating circuit configured to generate the first period control signal in response to an operation activation signal and to generate the second period control signal in response to a column select line disable signal.

5. The apparatus of claim 1, wherein a column select line disable signal is generated in response to a clock cycle following the clock cycle in which the write command is applied.

6. The apparatus of claim 5, wherein the column select line signal generator is in the first operational mode when a command is applied to the command buffer within two clock cycles after a write command is applied to the command buffer.

7. The apparatus of claim 5, wherein the column select line signal generator is in the second operational mode when a command is applied to the command buffer more than two clock cycles after a write command is applied to the command buffer.

8. An apparatus for generating a column select line signal in a semiconductor memory device, comprising:
a column select line signal generator including (i) a column select line signal generating circuit configured to set the column select line signal in response to a column select line enable signal and to reset the column select line signal in response to the earlier of a first period control signal or a second period control signal, and (ii) a period control signal generating circuit configured to generate the first period control signal in response to an operation activation signal and to generate the second period control signal in response to a column select line disable signal.

9. The apparatus of claim 8, wherein the column select line disable signal comprises a delayed column select line disable signal.

10. The apparatus of claim 8, further comprising a delay cell configured to receive the column select line disable signal and responsively generate a delayed column select line disable signal.

11. The apparatus of claim 8, wherein the column select line disabling unit is configured to generate the column select line disable signal in response to a clock cycle of the clock signal following the clock cycle in which the operation command is applied to the command buffer.

12. The apparatus of claim 11, wherein the column select line disabling unit is configured to generate the column select line disable signal in a clock cycle that is at least two clock cycles after the clock cycle in which the operation activation signal is generated.

13. An apparatus for generating a column select line signal in a semiconductor memory device, comprising:
a command buffer configured to receive an operation command and responsively generate a pre-command pulse; and
a column select line signal generator including (i) a column select line signal generating circuit configured to set the column select line signal in response to a column select line enable signal and to reset the column select line signal in response to the earlier of a first period control signal or a second period control signal, and (ii) a period control signal generating circuit configured to generate the first period control signal in response to the pre-command pulse and to generate the second period control signal in response to a column select line disable signal.

14. The apparatus of claim 13, further comprising a delay cell configured to generate a delayed column select line disable signal, wherein the period control signal generating circuit is configured to generate the second period control signal in response to the delayed column select line disable signal.

15. The apparatus of claim 13, wherein the column select line signal generator has a first operational mode when an operation command is applied to the command buffer within a predetermined number of clock cycles after a write command is applied to the command buffer, and the column select line generator has a second operational mode when an operation command is not applied to the command buffer within the predetermined number of clock cycles after a write command is applied to the command buffer, and wherein the column select line signal has a first pulse width when the column select line signal generator is in the first operational mode and a second pulse width when the column select line signal generator is in the second operational mode.

16. The apparatus of claim 15, wherein the second pulse width is longer than the first pulse width.

17. The apparatus of claim 15, wherein the predetermined number of clock cycles is two clock cycles.

18. A semiconductor memory device comprising:
a memory cell array having a plurality of memory blocks in which unit memory cells each having an access transistor and a storage capacitor are connected at respective intersections between rows and columns in a matrix form;
a row selecting circuit for selecting rows of the memory cells; and
a column selecting circuit for selecting columns of the memory cells using a column select line signal, the column selecting circuit comprising a column select line signal generator comprising (i) a column select line signal generating circuit configured to set the column select line signal in response to a column select line enable signal and to reset the column select line signal in response to the earlier of a first period control signal or a second period control signal, and (ii) a period control signal generating circuit configured to generate the first period control signal in response to an operation activation signal and to generate the second period control signal in response to a column select line disable signal.

19. The device of claim 18, wherein the column select line signal generator has a first operational mode when an operation command is applied to the command buffer within a predetermined number of clock cycles after a write command is applied to the command buffer, and the column select line generator has a second operational mode when an operation command is not applied to the command buffer within the predetermined number of clock cycles after a write command is applied to the command buffer, and wherein the column select line signal has a first pulse width when the column select line signal generator is in the first operational mode and a second pulse width different from the first pulse width when the column select line signal generator is in the second operational mode.

20. The device of claim 19, wherein the second pulse width is longer than the first pulse width.

21. The device of claim 19, wherein the predetermined number of clock cycles is two clock cycles.

22. A circuit for generating a column select line signal in a semiconductor memory device, comprising:

a continuity determination unit configured to determine if an operation command is applied within a predetermined time after a write command is applied; and a signal generator operably connected to the continuity determination unit and configured to generate a column select line signal having a different pulse width depending on whether the operation command is input within the predetermined time after the write command.

23. A method for generating a column select line signal in a semiconductor memory device including a column selection circuit configured to select a column line connected to a memory cell for data access, the method comprising:

generating a column select line signal in response to a column select line enable signal, the column select line signal having a first pulse width when the column selection circuit is in a first operational mode and a second pulse width when the column selection circuit is in a second operational mode, wherein the second pulse width is longer than the first pulse width.

24. The method of claim 23, wherein the predetermined number of clock cycles is two clock cycles.

* * * * *

UNITED STATES PATENT AND TRADEMARK OFFICE
CERTIFICATE OF CORRECTION

PATENT NO.       : 7,295,488 B2
APPLICATION NO.  : 11/272900
DATED            : November 13, 2007
INVENTOR(S)      : Hwang et al.

It is certified that error appears in the above-identified patent and that said Letters Patent is hereby corrected as shown below:

Column 15, Claim 1, Line 4: Please correct "pulse width"
                                    To read -- pulse width; --

Column 15, Claim 8, Line 64: Please correct, "signal."
  To read -- signal;
      a command buffer configured to receive an operation command
  and responsively generate the operation activation signal;
      a column select line enabling unit configured to generate a column
  select line enable signal in response to the operation activation signal;
  and
      a column select line disabling unit configured to generate a column
  select line disable signal in response to the operation activation signal
  and a clock signal. --

Column 16, Claim 13, Line 30: Please correct, "signal."
    To read -- signal;
    wherein the pre-command pulse has a shift point that is
  substantially synchronous with a clock cycle following a clock cycle in
  which the operation command is applied to the command buffer. --

Column 17, Claim 18, Line 9: Please correct, "signal."
  To read -- signal;
      a command buffer configured to receive an operation command
  and responsively generate the operation activation signal;
      a column select line enabling unit configured to generate a column
  select line enable signal in response to the operation activation signal;
  and
      a column select line disabling unit configured to generate a column
  select line disable signal in response to the operation activation signal
  and a clock signal. --

Column 18, Claim 22, Line 11: Please correct, "command."
  To read -- command;
      wherein the predetermined time comprises two clock cycles after
  the write command is applied. --

UNITED STATES PATENT AND TRADEMARK OFFICE
CERTIFICATE OF CORRECTION

PATENT NO. : 7,295,488 B2
APPLICATION NO. : 11/272900
DATED : November 13, 2007
INVENTOR(S) : Hwang et al.

It is certified that error appears in the above-identified patent and that said Letters Patent is hereby corrected as shown below:

Column 18, Claim 23, Line 22:  Please correct, "width."
 To read -- width;
   receiving an operation command and responsively generating an operation activation signal; and
   generating a column select line enable signal in response to the operation activation signal;
   wherein the column selection circuit is in the first operational mode when an operation command is applied to a command buffer within a predetermined number of clock cycles after a write command is applied to the  command buffer, and the column selection circuit is in the second operational mode when an operation command is not applied to the command buffer within the predetermined number of clock cycles after a write command is applied to the command buffer. --

Signed and Sealed this

Eighteenth Day of March, 2008

JON W. DUDAS
*Director of the United States Patent and Trademark Office*